United States Patent
Chao et al.

(10) Patent No.: US 7,582,530 B2
(45) Date of Patent: Sep. 1, 2009

(54) MANAGING FLOATING GATE-TO-FLOATING GATE SPACING TO SUPPORT SCALABILITY

(75) Inventors: Henry Chao, Cupertino, CA (US); Krishna Parat, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 163 days.

(21) Appl. No.: 11/478,776

(22) Filed: Jun. 30, 2006

(65) Prior Publication Data

US 2008/0001208 A1    Jan. 3, 2008

(51) Int. Cl.
*H01L 21/336* (2006.01)

(52) U.S. Cl. .......... 438/265; 438/257; 438/259; 257/315; 257/316; 257/E29.129; 257/E29.3; 257/E21.68

(58) Field of Classification Search .......... 438/257, 438/259, 263, 264, 265, 270, 295, 296, 299; 257/315, 316, E29.129, E29.3, E21.68
See application file for complete search history.

(56) References Cited

U.S. PATENT DOCUMENTS

| 6,232,184 | B1 * | 5/2001 | Wang et al. | 438/265 |
| 6,555,434 | B2 * | 4/2003 | Koh | 438/257 |
| 6,909,140 | B2 * | 6/2005 | Hsu | 257/315 |
| 2002/0000604 | A1 * | 1/2002 | Chhagan et al. | 257/315 |
| 2006/0027856 | A1 * | 2/2006 | Chung et al. | 257/315 |

* cited by examiner

*Primary Examiner*—Ha Tran T Nguyen
*Assistant Examiner*—Daniel Whalen
(74) *Attorney, Agent, or Firm*—Lee & Hayes, PLLC

(57) ABSTRACT

Formation techniques are utilized to increase the space or distance between floating gates of a memory array of floating gate transistors. In at least some embodiments, floating gates are first formed over the substrate and then portions of the floating gates are removed to increase the spacing between the floating gates. An interlayer dielectric layer is then formed over the substrate and a control gate layer is formed thereover.

10 Claims, 4 Drawing Sheets

MANAGING FLOATING GATE-TO-FLOATING GATE SPACING TO SUPPORT SCALABILITY

BACKGROUND

Floating gate transistors can be used to form memory devices such as flash memory devices. As memory cell widths or pitches of the floating gate transistors are scaled down, the distance between adjacent floating gates decreases. It is desirable, however, to maintain control gate width dimensions between adjacent floating gates and, in at least some instances, the doping of the control gate between adjacent floating gates.

For example, a decreased control gate width dimension can lead to undesirable coupling between adjacent floating gates. That is, if the width dimension of the control gate between adjacent devices is too small, then there is an increased chance that adjacent floating gates will electronically couple.

Further, when polysilicon is used as a control gate, a decreased width between adjacent floating gates can lead to polysilicon depletion which, in turn, can cause a loss of the gate coupling area thus rendering the associated memory call inoperative.

DETAILED DESCRIPTION

In the embodiments described below, formation techniques are utilized to increase the space or distance between floating gates of a memory array of floating gate transistors prior to formation of an interdielectric layer. In the described embodiments, floating gates are first formed over the substrate and then portions of the floating gates are removed to increase the spacing between the floating gates. Any suitable techniques can be utilized to remove the floating gate portions examples of which are provided below. By removing the floating gate portions, additional space is provided for the control gate between adjacent floating gates. By providing additional space between the adjacent floating gates, effects associated with the loss of gate coupling area can be mitigated, as will be appreciated by the skilled artisan.

Figure 1:
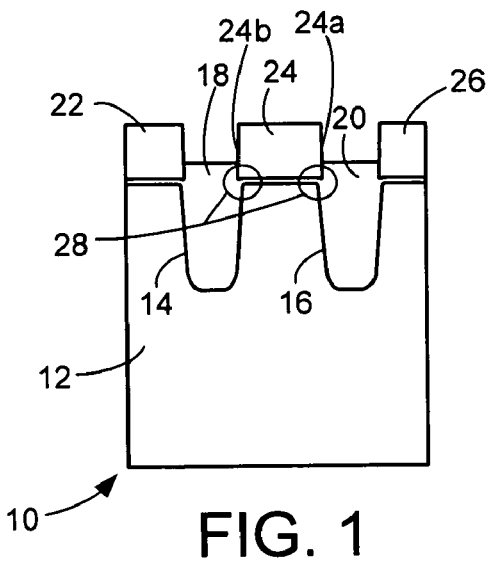
FIG. 1 is a diagrammatic side sectional view of a semiconductive substrate undergoing processing in accordance with one embodiment.

Referring to FIG. 1, a semiconductive substrate is shown generally at 10. Substrate 10 can comprise any suitable substrate material that can be used to form floating gate transistors. In this particular example, substrate 10 comprises a bulk monocrystalline silicon substrate 12.

Isolation trenches 14, 16 are formed in substrate 12 and then filled with an insulating material such as a suitable oxide material. Any suitable techniques can be utilized to form trench isolation regions.

One way of forming such trenches is to first form, over the surface of substrate 12, a pad oxide layer and an overlying silicon nitride layer. Next, a masking layer is formed over the oxide and nitride layer and trench patterns are formed in the masking layer. Next, the oxide and nitride layers are removed from within the trench patterns and material of substrate 12 is etched for form trenches 14, 16. Thermal oxide layers can then be formed in the individual trenches, with the trenches being subsequently filled with a trench filling material such as silicon oxide. Such layer can be formed by chemical vapor depositing the silicon oxide layer over the substrate sufficient to fill the trenches and cover the previously-formed nitride layer. The silicon oxide layer can then be polished back to the nitride layer. Next, the remaining nitride layer and pad oxide layer can be removed to leave behind trench isolation structures 18, 20 without the illustrated floating gates.

At this point, implantation steps can take place to implant dopants into material of substrate 12, as will be appreciated by the skilled artisan. Next, floating gate material can be blanket deposited over a tunnel oxide layer that is formed over substrate 12. Any suitable floating gate material can be used. In one embodiment, the floating gate material comprises polysilicon. Once deposited, the floating gate material can be chemical mechanical polished to remove the material from over the trench isolation structures 18, 20. This self-aligns the floating gate material with the active region edges of the substrate 12. This defines a plurality of parallel lines or floating gates 22, 24, 26 running into and out of the page.

Next, portions of the trench isolation structures 18, 20 are removed or recessed to expose corresponding sidewalls of the floating gates 22, 24, 26. Here, sidewalls 24a, 24b are shown for floating gate 24. In this example, portions of the trench isolation structures 18, 20 extend over the bottom portions of the individual sidewalls of the respective floating gates.

It is to be appreciated and understood that the structure of FIG. 1 constitutes a starting structure for the processing that takes place just below. As will be appreciated by the skilled artisan, there are a number of different ways one might use to arrive at the structure illustrated in FIG. 1. As such, the description above is not intended to limit application of the claimed subject matter to only those processes and/or materials mentioned above.

It should also be appreciated and understood that isolation techniques other than trench isolation can be utilized without departing from the spirit and scope of the claimed subject matter. In addition, different trench isolation techniques can be utilized without departing from the spirit and scope of the claimed subject matter.

It is also to be appreciated and understood that while the above-described process utilizes a self-aligned process to create the separation between the floating gates, standard patterning techniques can also be used.

In the above-described formation process, each of the floating gates includes overhang regions that extend over trenches 14, 16. Examples of these overhang regions are shown at 28 for floating gate 24. It is to be appreciated and understood that other formation techniques can be used that do not necessarily result in the overhang region and that the techniques described in this document are equally applicable there.

Next, laterally inward portions of the floating gates are removed to provide a floating gate with a narrower width than the initially-formed self-aligned floating gate. In this example, at least some portions of the floating gate sidewalls that are not covered by the isolation structures 18, 20 are removed. Any suitable technique can be utilized to remove the laterally inward portions, examples of which are described just below.

Figure 2:
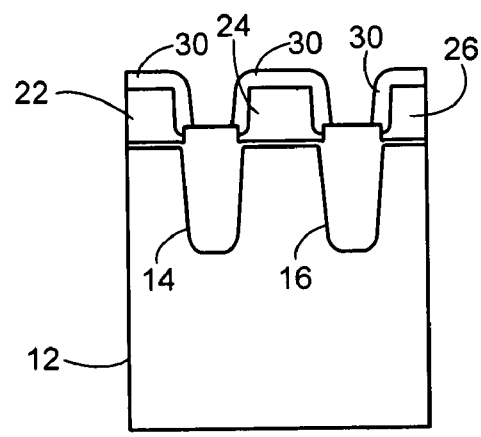
FIG. 2 is a diagrammatic side sectional view of a semiconductive substrate undergoing processing in accordance with one embodiment.

Referring to FIG. 2, in embodiments that utilize polysilicon as the material for the floating gates, laterally inward portions of the floating gates are removed by thermally oxidizing the polysilicon. This is done by forming or growing a thermal oxide layer 30 over the floating gate. As will be appreciated by the skilled artisan, the formation of the thermal oxide consumes portions of the polysilicon to laterally recess the sidewalls of the floating gates. The oxidation thickness can be set to consume an amount of polysilicon to achieve a desired increase in the spacing between the floating gates.

Figure 3:
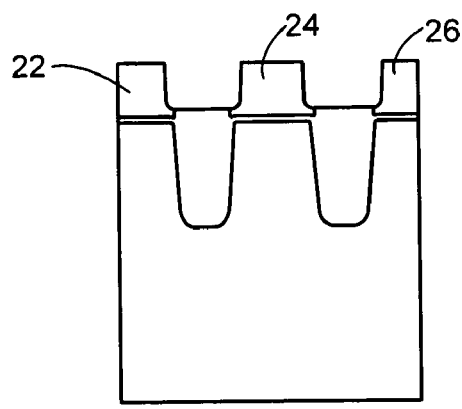
FIG. 3 is a diagrammatic side sectional view of a semiconductive substrate undergoing processing in accordance with one embodiment.

Referring to FIG. 3, an isotropic etch is utilized to remove the thermal oxide layer from over floating gates 22, 24, 26. Any suitable isotropic etch can be utilized. For example, both isotropic wet and dry etches can be utilized.

In other embodiments, the structure of FIG. 3 can be formed from the structure of FIG. 1 by etching the floating gate material. Specifically, in at least one embodiment the floating gate material can be removed by isotropically etching the material. Here, the amount and duration of the isotropic etch can be selected to achieve the desired separation between adjacent floating gates.

Figure 4:
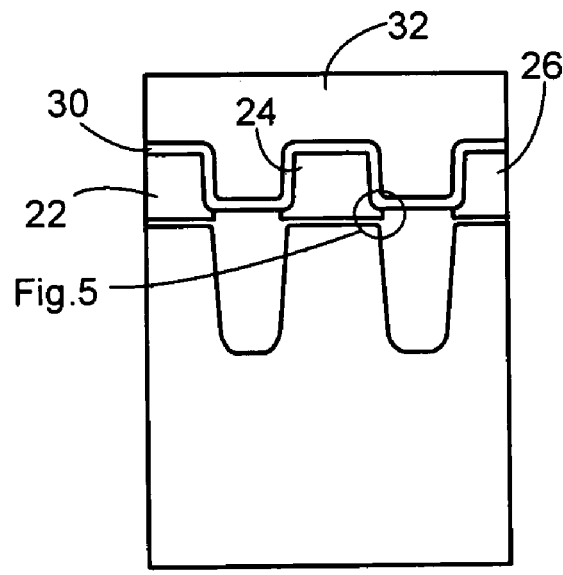
FIG. 4 is a diagrammatic side sectional view of a semiconductive substrate undergoing processing in accordance with one embodiment.

Referring to FIG. 4, an interlayer dielectric layer 30 is formed over the substrate and floating gates 22, 24, 26. Any suitable dielectric layer can be utilized. In one embodiment, such layer comprises an ONO (oxide-nitride-oxide) layer. Following this, a control gate layer 32 is formed over the substrate.

Figure 5:
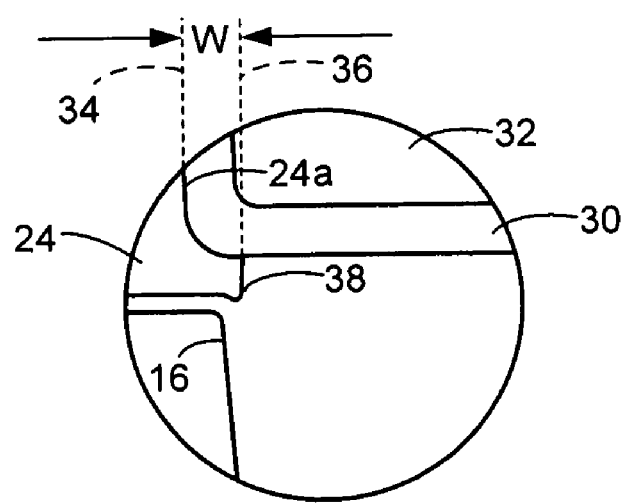
FIG. 5 is an enlarged view of a portion of the FIG. 4 substrate.

Referring to FIG. 5, an enlarged portion of FIG. 4 is shown. Here, a portion of floating gate 24 is illustrated and shows an extension 34 of a first sidewall portion, an extension 36 of a second sidewall portion, and a spacing dimension W that is defined therebetween. In this embodiment, spacing dimension W allows for and preserves the overhang regions of the floating gate, such as the individual overhang region that overhangs the corresponding trench 16. Although any suitable width can be utilized, in cell pitches below 150 nm, widths on the order of 50 Angstrom can be utilized.

In this view, sidewall 24a of floating gate 24 extends upwardly from a base 38 that defines a region of overhang for the floating gate. As the sidewall 24a extends upwardly, it tapers inwardly to define the spacing dimension W.

Forming the floating gates of the floating gate array as described above can allow scaling of the cell pitches while, at the same time maintain a desirable spacing between adjacent floating gates. Maintaining a desirable spacing between the floating gates can mitigate effects associated with the loss of gate coupling.

Exemplary Method

Figure 6:
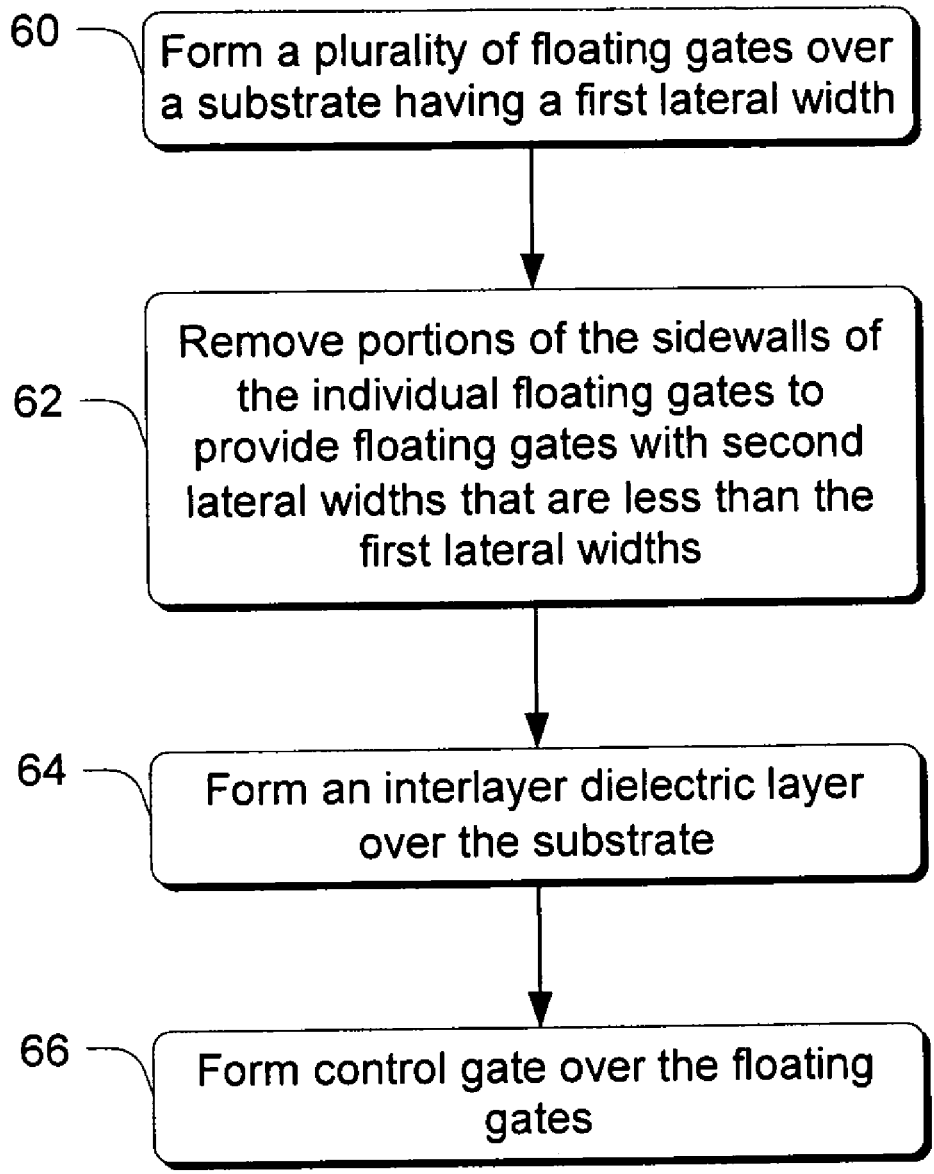
FIG. 6 is a flow diagram that describes acts in a method in accordance with one embodiment.

FIG. 6 is a flow diagram that describes acts in a method in accordance with one embodiment.

Act 60 forms a plurality of floating gates over a substrate. The floating gates have a first lateral width. Act 62 removes portions of the sidewalls of the individual floating gates to provide floating gates with second lateral widths that are less than the first lateral widths. Examples of how this act can be accomplished are given above. Act 64 forms an interlayer dielectric layer over the substrate. Examples of how this can be done are given above. Act 66 forms a control gate over the floating gates.

The above-described methods can be utilized in connection with other techniques to create sufficient gate coupling in floating gate transistors as the pitch dimensions are decreased. For example, such other techniques can include, by way of example and not limitation, increasing the vertical extent of the floating gate overlap of the control gate. Alternately or additionally, such techniques can include increasing the doping of the control gate polysilicon between the floating gates. Alternately or additionally, such techniques can include utilizing a high-k interdielectric material between the control and floating gates. Alternately or additionally, such techniques can include utilizing alternatively shaped floating gate topographies.

Exemplary System

Figure 7:
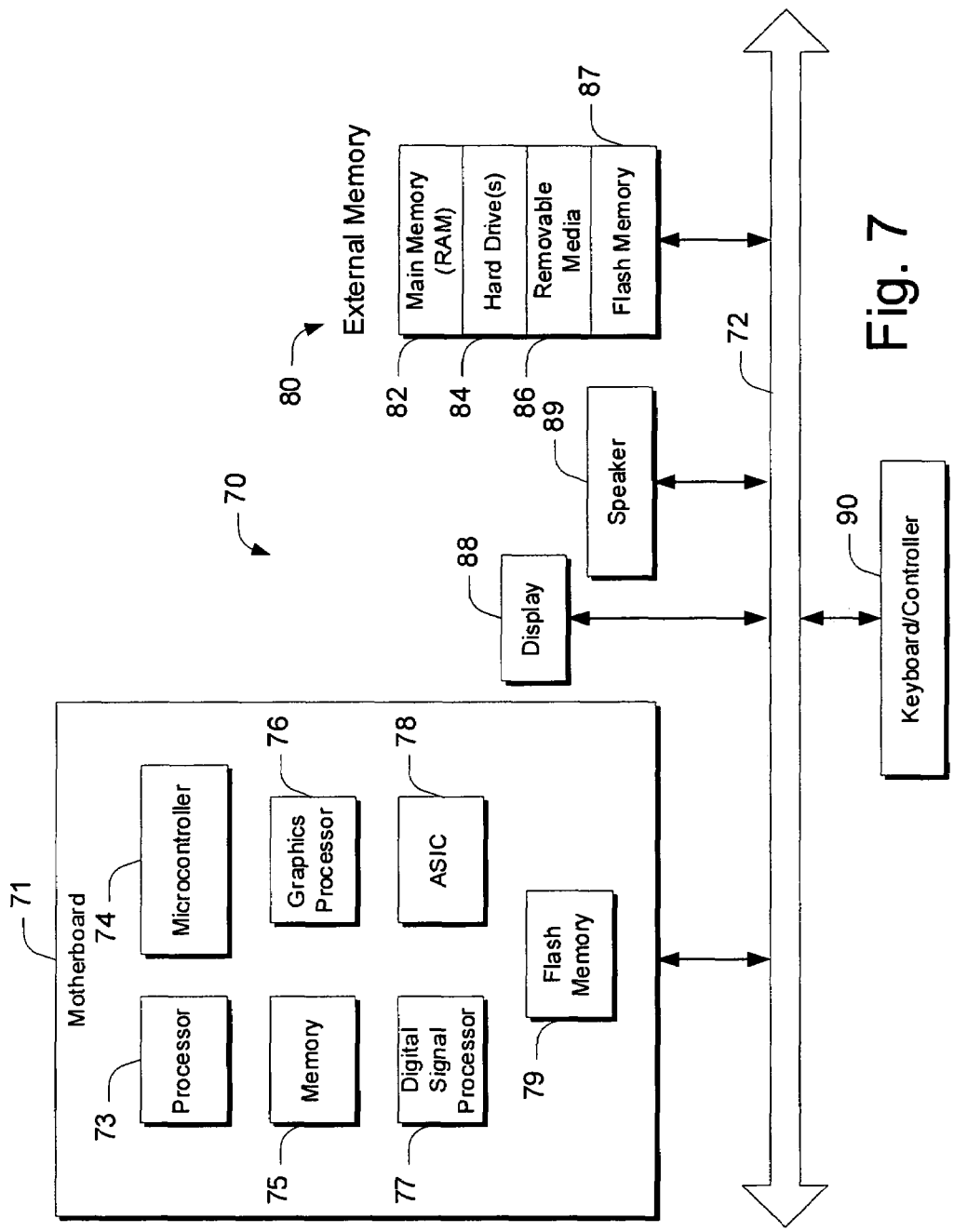
FIG. 7 is a block diagram of an electronic system that incorporates at least one device of the type shown in FIGS. 1-5.

Referring to FIG. 7, a block diagram of an exemplary electronic system that can include floating gate transistors such as those described above is shown generally at 70. Such electronic system can comprise a computer system that includes a motherboard 71 which is electrically coupled to various components in electronic system 70 via a system bus 72. System bus 72 may be a single bus or any combination of busses.

Motherboard 71 can include, among other components, one or more processors 73, a microcontroller 74, memory 75, a graphics processor 76 or a digital signal processor 77, and/or a custom circuit or an application-specific integrated circuit 78, such as a communications circuit for use in wireless devices such as cellular telephones, pagers, portable computers, two-way radios, and similar electronic systems and a flash memory device 79 that has been constructed in accordance with the techniques described above.

The electronic system 70 may also include an external memory 80 that in turn includes one or more memory elements suitable to the particular application, such as a main memory 82 in the form of random access memory (RAM), one or more hard drives 84, and/or one or more drives that handle removable media 86, such as floppy diskettes, compact disks (CDs) and digital video disks (DVDs). In addition, such external memory may also include a flash memory device 87 that has been constructed in accordance with the techniques described above.

The electronic system 70 may also include a display device 88, a speaker 89, and a controller 90, such as a keyboard, mouse, trackball, game controller, microphone, voice-recognition device, or any other device that inputs information into the electronic system 70.

Conclusion

The above-described methodology can produce floating gate transistors that have an increased space between adjacent floating gates. This, in turn, can facilitate sufficient gate coupling as device pitches are scaled.

Although the embodiments have been described in language specific to structural features and/or methodological acts, it is to be understood that the subject matter defined in the appended claims is not necessarily limited to the specific features or acts described. Rather, the specific features and acts are disclosed as exemplary forms of implementing the claimed subject matter.

What is claimed is:

1. A method comprising:
   forming a plurality of floating gates over a substrate, each individual floating gate being separated by a first trench isolation structure and a second isolation trench structure, wherein each individual floating gate has a base having a lateral width that overhangs the first and second trench isolation structure, the base of each individual floating gate being a bottom surface of each individual floating gate substantially parallel to and nearest the substrate; and removing laterally inward portions of each individual floating gate to provide a plurality of modified individual floating gates, each modified individual floating gate having a pair of sidewalls that taper inwardly away from the first and second trench isolation structure such that the lateral width of the base of each modified individual floating gate is greater than the lateral width of the upper surface of each modified individual floating gate, the upper surface of each individual floating gate being that surface substantially opposite the base, wherein the base of each modified individual floating gate remains overhanging the first and second isolation trench structure, wherein the act of removing comprises thermally oxidizing the individual floating gates to form a layer of thermal oxide thereover each individual floating gate and isotropically etching the thermal oxide layer.

2. The method of claim 1, wherein the act of forming a plurality of floating gates comprises forming said floating gates from polysilicon.

3. The method of claim 1, wherein the act of forming a plurality of floating gates comprises using a self-aligned process to form said floating gates.

4. The method of claim 1, wherein the act of removing comprises etching material of the floating gates.

5. The method of claim 4, wherein the etching of the material comprises isotropically etching the material.

6. The method of claim 1 further comprising forming an interlayer dielectric layer over the floating gates and forming a control gate layer over the interlayer dielectric layer.

7. A method comprising:
forming isolation trenches in a semiconductive substrate;
forming trench isolation structures within the trenches;
forming a plurality of polysilicon floating gates over the substrate between the isolation trenches, wherein each individual floating gate has a base and sidewalls, the base being a bottom surface of each individual floating gate substantially parallel to and nearest the substrate, the base of each individual floating gate being formed such that each individual floating gate extends over the isolation trenches;
removing at least some material of each individual floating gate to form a modified individual floating gate, wherein the act of removing comprises thermally oxidizing the individual floating gates to form a layer of thermal oxide thereover each individual floating gate and isotropically etching the thermal oxide layer;
forming an interlayer dielectric layer over the floating gates; and
forming a control gate layer over the interlayer dielectric layer.

8. The method of claim 7, wherein the act of removing comprises etching material of the floating gates.

9. The method of claim 8, wherein the etching of the material comprises isotropically etching the material.

10. The method of claim 7, wherein the act of removing forms modified floating gates having sidewalls that taper inwardly at the base away from the isolation trenches such that a lateral width of the base is greater than a lateral width of an upper surface of the modified floating gate, the upper surface being that surface substantially opposite the base, wherein the base of the individual floating gate remains extended over the isolation trench.

* * * * *